United States Patent [19]

Iijima et al.

[11] Patent Number: 4,768,119
[45] Date of Patent: Aug. 30, 1988

[54] NON-CONTACT HEAD WITH VARIABLE CLEARANCE COMPENSATING MEANS

[75] Inventors: Kenzaburou Iijima; Kazuo Kurahashi; Yoshinori Hayashi, all of Hamamatsu, Japan

[73] Assignee: Nippon Gakki Seizo Kabushiki Kaisha, Japan

[21] Appl. No.: 21,179

[22] Filed: Mar. 3, 1987

[30] Foreign Application Priority Data

Mar. 5, 1986 [JP] Japan .................................. 61-47760
May 28, 1986 [JP] Japan .................................. 61-121127
Jun. 20, 1986 [JP] Japan .................................. 61-144173

[51] Int. Cl.⁴ .......................... G11B 5/12; G11B 5/10; G11B 5/48
[52] U.S. Cl. ................................... 360/103; 360/109; 340/347 P
[58] Field of Search .............................. 369/43, 44–45; 360/99–103, 109, 113; 340/349 P

[56] References Cited

U.S. PATENT DOCUMENTS 3,992,576  11/1976  Sugiura ................................. 369/43

Primary Examiner—Robert L. Richardson
Attorney, Agent, or Firm—Ostrolenk, Faber, Gerb & Soffen

[57] ABSTRACT

A non-contact detection head which compensates for variation and the spacing between a detection head and a circular recording medium. The recording medium has a magnetized pattern recorded along the periphery thereof, and is mounted on a central rotary shaft. A detection head is spaced from and faces the recorded pattern on the recording medium and generates an output as a function of the recorded pattern. In one embodiment, pneumatic means is provided for preventing fluctuations in the clearance between the recording medium and the detection head from influencing the output of the detection head. In a second embodiment, a mechanical arrangement is provided to achieve this result. In a third embodiment, an electrical circuit is provided to compensate for fluctuations in the clearance between the recording medium and the detection head.

7 Claims, 6 Drawing Sheets

NON-CONTACT HEAD WITH VARIABLE CLEARANCE COMPENSATING MEANS

BACKGROUND OF THE INVENTION

The present invention relates to an improved non-contact detection type rotary encoder, and more particularly relates to improvements in the output characteristics of a rotary encoder which includes a circular recording medium having a recorded pattern magnetized along the periphery thereof and mounted to a central rotary shaft and a detection head spaced from and facing the recorded pattern on the recording medium.

A conventional rotary encoder of the above-described type in generally has a construction in which a central rotary shaft is coaxially held in a hollow, cylindrical housing and a detection head is fixedly arranged within the housing while spacedly facing a recorded pattern magnetized along the periphery of a circular recording medium mounted to the rotary shaft. As the recording medium rotates, a magnetic field applied to the detection head changes depending on the recorded pattern on the recording medium and, in response to such change in the magnetic field, the detection head generates a series of output signals representative of the recorded pattern on the recording medium. Generation of the output signals is carried out free of trouble as long as the clearance between the recording medium and the detection head is kept constant.

In practice, however, the clearance often fluctuates due to warps developed on the recording medium, improper mounting of the recording medium and inherent contortion caused by poor precision in production. Such fluctuations in clearance greatly disturb stability in output characteristics, thereby seriously degrading the SN ratio and precision in detection.

SUMMARY OF THE INVENTION

It is the object of the present invention to remove the negative influences resulting from the fluctuation in clearance between a recording medium and a detection head arranged to spacedly face a recorded pattern on the recording medium.

In accordance with the basic concept of the present invention, a rotary encoder is provided with means for canceling the influence of fluctuations in clearance between the recording medium mounted to a central rotary shaft and the detection head.

In accordance with the first preferred embodiment of the present invention, the detection head includes a detecting element and the canceling means includes means for holding the detecting element in an orientation spaced from and facing a recorded pattern on the recording medium, means for supporting the holding means for movement with respect to the recording medium, means for urging the holding means to move towards the recording medium and means for ejecting air via the holding means against the recording medium.

In accordance with the second preferred embodiment of the present invention, the detection head includes a detecting element, the canceling means includes a base plate idly mounted to the rotary shaft, while being locked against free axial movement with respect to the recording medium, and fixedly coupled to a housing of the encoder, and the detecting element is mounted to the base plate.

In accordance with the third preferred embodiment of the present invention, the detection head includes a pair of detecting elements spaced from each other at positions of the maximum and minimum clearances, and the canceling means includes an electric circuit which includes the detecting elements.

DESCRIPTION OF THE PREFERRED EMBODIMENT

Figure 1:
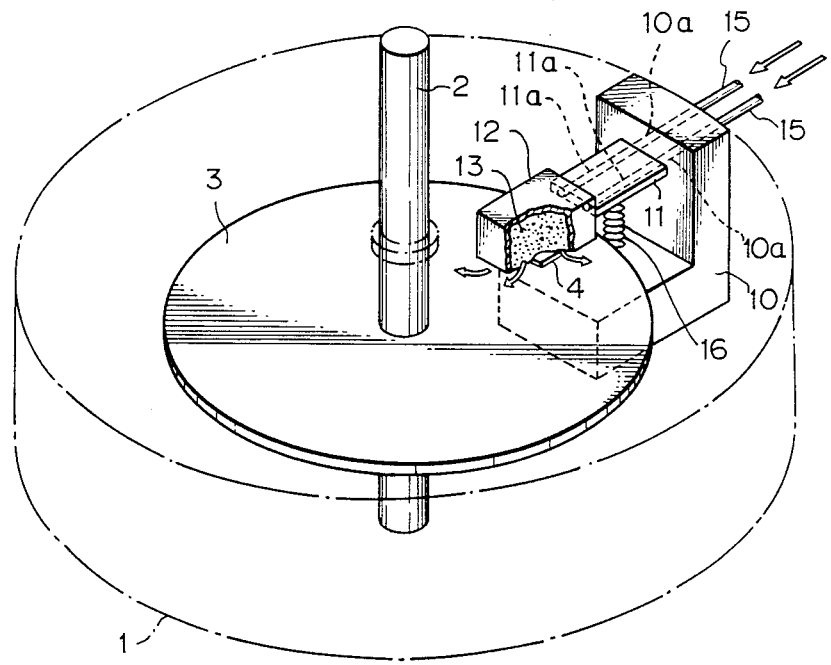
FIG. 1 is a perspective view, partly removed for easier understanding, of the first embodiment of the rotary encoder in accordance with the present invention.

In the following description, substantially similar elements in different embodiments are indicated with like reference numerals and symbols.

The first embodiment of the rotary encoder in accordance with the present invention is shown in FIGS. 1 through 4 in which, as stated above, the detection head includes a detecting element and the canceling means includes means for holding the detecting element at an orientation spaced from and facing a recorded pattern on a recording medium, means for supporting the holding means for movement with respect to the recording medium, means for urging the holding means to move towards the recording medium and means for ejecting air via the holding means against the recording medium.

Figure 2:
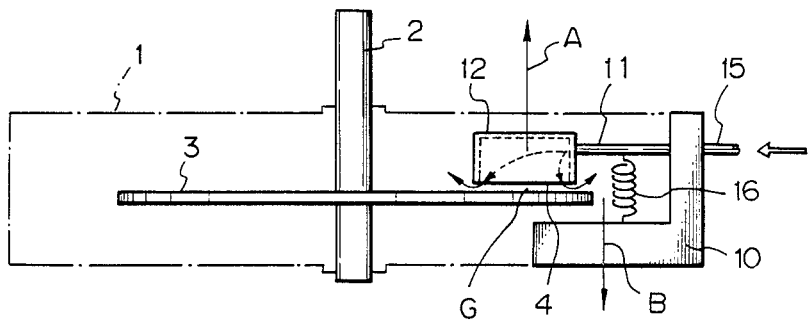
FIG. 2 is a side view of the rotary encoder shown in FIG. 1.
Figure 3:
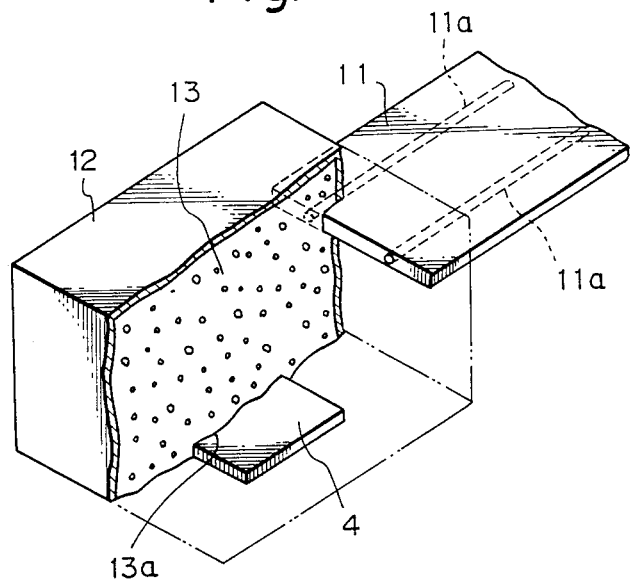
FIG. 3 is a perspective view, partly removed for easier understanding, of the main part of the rotary encoder shown in FIG. 1.

More specifically in FIGS. 1 and 2, a circular recording medium 3, e.g. a magnetic recording medium, is mounted to a central rotary shaft 2 which is carried in a known manner within a hollow, cylindrical housing 1. Though not shown in the illustration, a recorded pattern is magnetized along the periphery of the recording medium 3. An L-shaped bracket 10 arranged in the housing 1 carries a flexible supporter plate 11 at the distal end thereof. A casing 12 is coupled to the free end of the supporter plate 11. The casing 12 is open downwards towards the recorded pattern on the recording medium 3. A porous material 13 is packed in the casing 12 for passage of air introduced into the system and the pore ratio of the porous material 13 is preferably in a range from 40 to 60%. A recess 13a (FIG. 3) is formed in the bottom face of the porous material 13 in order to tightly accommodate a detecting element 4, i.e. a magnetoresistive element in the case of this embodiment. Air passages 11a are formed through the supported plate 11 and open downstream in the porous material 13. Air passages 10a (FIG. 1) are formed through the bracket 10 in communication with the air passages 11a in the supporter plate 11. The air passages 10a are associated with respective tubes 15 for communication with a pressured pneumatic source not shown. A tension spring 16 is interposed between the supporter plate 11 and the bracket 10 in order to constantly pull the casing 12 towards the recording medium 3.

When pressured air is introduced into the casing 12 via the air passages 10a and 11a, the pressured air is ejected downwards via the porous material 13 and impinges against the recording medium 3 as shown with arrows. This impingement generates a propelling force to move the detecting element 4 held by the porous material 13 away from the recording medium 3, i.e. in the direction of an arrow A in FIG. 2.

On the other hand, the detecting element 4 is pulled by the tension spring 16 towards the recording medium 3, i.e. in the direction of an arrow B opposite to the allow A. When the pulling force of the spring balances with the propelling force of the air, the casing 12, i.e. the detecting element 4, is kept stationary and, as a consequence, the clearance G (FIG. 2) between the recording medium 3 and the detecting element 4 is kept constant.

In practical application, it was confirmed through experimental observation that the clearance was always kept in a range of $2.0 \pm 0.05$ $\mu$m and that the magnetoresistive detecting element 4 moved to offset fluctuations in clearance with complete fidelity. When the recording medium 3 was magnetized by a sine wave having a constant period, even magnetization of 5 to 10 $\mu$m could be exactly and stably detected by the MR detecting element 4.

Figure 4:
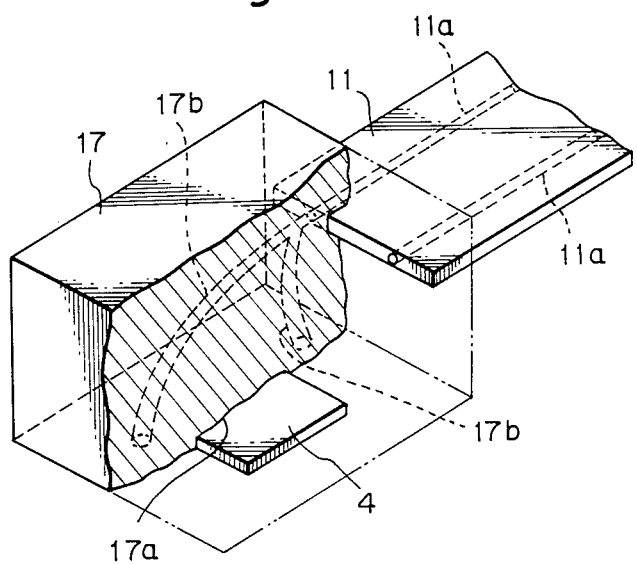
FIG. 4 is a perspective view, partly removed, of a modification of the main part shown in FIG. 3.

One modification of the above-described rotary encoder is shown in FIG. 4 wherein a holder block 17 made of a non-magnetic, metallic material is coupled to the free end of the supporter plate 11 and a recess 17a is formed in the bottom face of the holder block 17 in order to tightly accommodate the detecting element 4. In communication with the air passages 11a in the supporter plate 11, a pair of air passages 17a are formed through the holder block 17 while opening in the bottom face of the latter.

In addition to the rotary encoder, the present invention is well applicable to linear encoders, optical encoders and electrostatic encoders too. As a substitute for the tension spring, a compression spring may be used with slight modification in arrangement.

Figure 5:
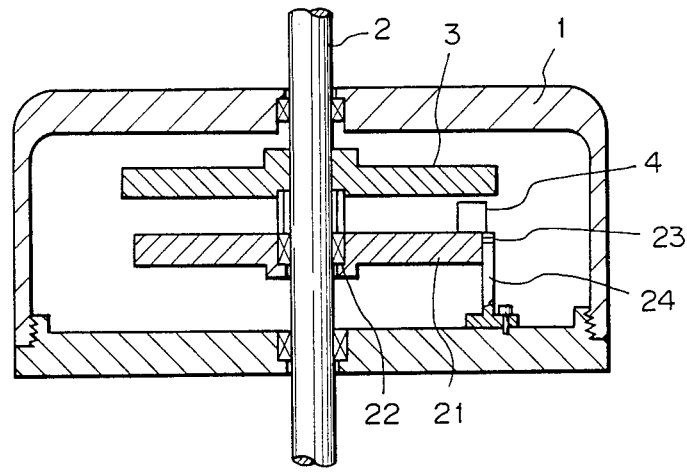
FIG. 5 is a side view, partly in section, of the second embodiment of the rotary encoder in accordance with the present invention.
Figure 6:
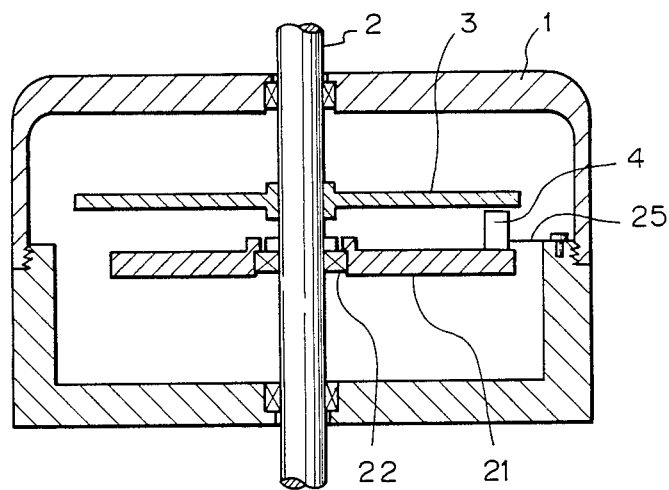
FIG. 6 is a side view, partly in section, of a modification of the rotary encoder shown in FIG. 5.

The second embodiment of the rotary encoder in accordance with the present invention is shown in FIGS. 5 and 6 in which, as stated above, the detection head includes a detecting element, the canceling means includes a base plate which is idly mounted to a rotary shift (to allow free rotary motion with respect to the shaft 2) while being locked against free axial movement with respect to the recording medium and being fixedly coupled to a housing and the detecting element is mounted to the base plate. More specifically in FIG. 5, a rotary shaft 2 is mounted to a hollow, cylindrical housing 1 via bearings (unnumbered) and a recording medium 3 (e.g. a magnetic recording medium) is concentrically secured to the rotary shaft 2 for rotation with the shaft. A circular base plate 21 is concentrically and idly mounted to the rotary shaft 2 via a bearing 22 so that it can rotate freely with respect to the shaft 2 but cannot move axially with respect to the recording medium 3. A recess 23 is formed in the periphery of the base plate 21 and engages a stopper pin 24 secured to the housing 1 so as to lock the base plate 21 against rotation. This engagement is deep enough to allow axial movement of the base plate 21 with respect to the rotary shaft 2 without any danger of disengagement. At a position corresponding to the recorded pattern on the recording medium 3, the detecting element 4 is mounted to the base plate 21.

In operation, the recording medium 3 rotates with the rotary shaft 2 but the base plate 21 is blocked against rotation by the pin-recess engagement. As the recording medium 3 rotates, the detecting element 4 generates a series of output signals representative of the recorded pattern on the recording medium 3.

When the rotary shaft 2 moves up and down, the recording medium 3 and the base plate 21 both follow its movement with complete fidelity. As a result, the distance between the recording medium 3 and the base plate 21 remains unchanged despite the movement of the rotary shaft 2 and there is no substantial fluctuation in the clearance between the recording medium 3 and the detecting element 4.

A modification of the above-described rotary encoder is shown in FIG. 6, in which a leaf spring 25 is secured to the housing 1 in an arrangement such that its free end presses against the periphery of the base plate 21 in order to block the same against rotation. In addition, vibration of the base plate 21 holding the detecting element 4 is also suppressed by this spring force.

Figure 7:
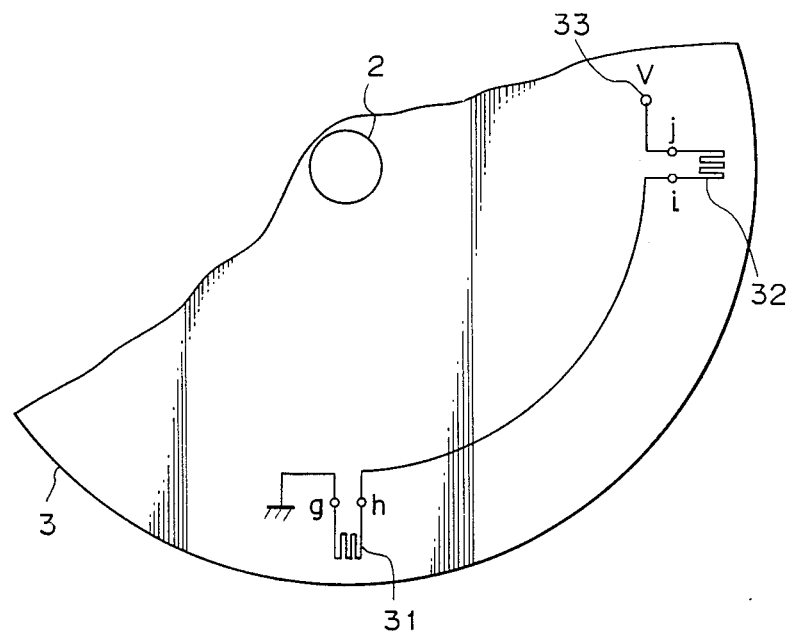
FIG. 7 is a plan view, partly removed, of the third enbodiment of the rotary encoder in accordance with the present invention.
Figure 8:
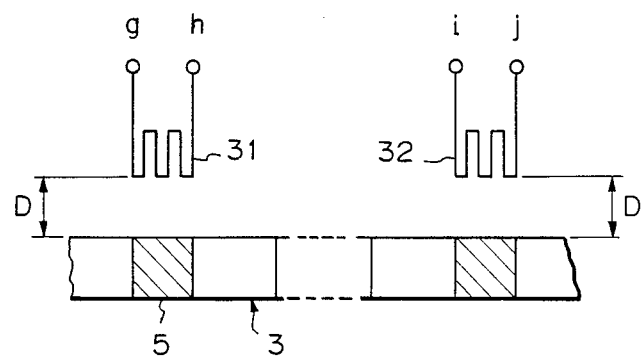
FIG. 8 shows arrangement of the detection head on the rotary encoder shown in FIG. 7.

The third embodiment of the rotary encoder in accordance with the present invention is shown in FIGS. 7 and 8, in which the detection head includes a pair of detecting elements spaced from each other at positions corresponding to the maximum and minimum clearances and the canceling means includes an electric circuit which includes the detecting elements. Fluctuations in clearance between the recording medium and the detection head reaches maximum and minimum levels at spaced positions in the plane of rotation about the axis of the recording medium and, in most cases, the two positions are out of phase by 90° about the axis of rotation. In the arrangement shown in FIG. 7, a pair of detecting elements 31 and 32 are located at positions corresponding to the positions of maximum and minimum fluctuation. In the case of the illustrated embodiment, these detecting elements 31 and 32 take the form of magnetic resistor elements. In other words, the detecting elements 31 and 32 are spaced apart from each other by 90° with respect to the axis of rotation of the recording medium 3. These detecting elements 31 and 32 are both spaced from a recorded pattern 5 (FIG. 8) on the recording medium 3 by a distance "D". The detecting element 31 has a pair of terminals "g" and "h" whereas the detecting element 32 has a pair of terminals "i" and "j". The terminals "h" and "i" are connected to each other, the terminal "g" is grounded and a voltage "V" is applied to between the terminals "j" and "g" an external terminal 33. As the clearance "D" of the detecting element 31 decreases, the clearance "D" of the detecting element 32 increases by the same amount. As the clearance "D" for the detecting element 31 increases, the clearance "D" for the detecting element 32 decreases by the same amount. As a result, reductions in clearance for one of the detecting elements is proportional to concurrent increases in the clearance for the other detecting elements. Fluctuations in the detection output from a detecting element corresponds to fluctuations in clearance for that detecting element. Since the pair of detecting elements 31 and 32 are connected in series to each other, their detection outputs are added. By this addition, fluctuations in detection output from the detecting elements 31 and 32 offset each other and, as a result, the ultimate detection output from the system is free of adverse influences due to fluctuations in the clearance between the recording medium and the detection head.

Figure 9:
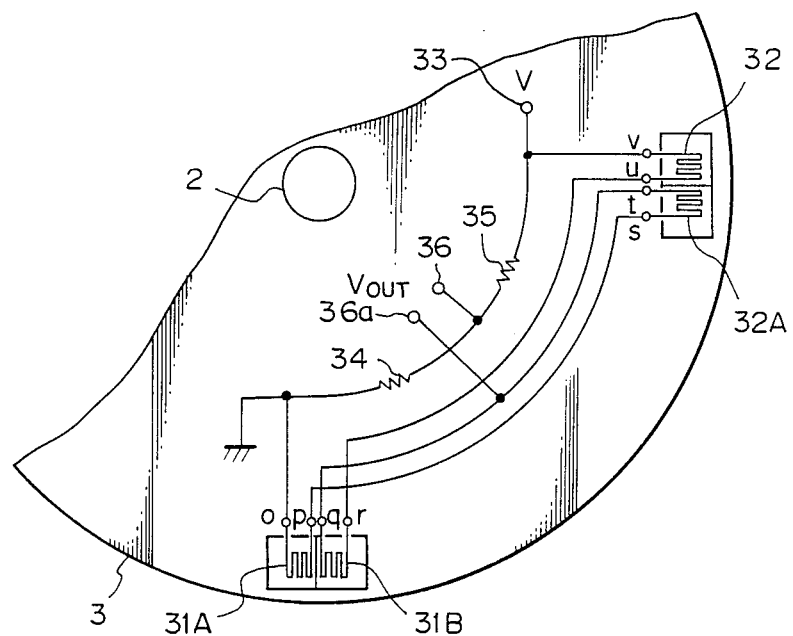
FIG. 9 is a plan view, partly removed, of a modification of the rotary encoder shown in FIG. 7.
Figure 10:
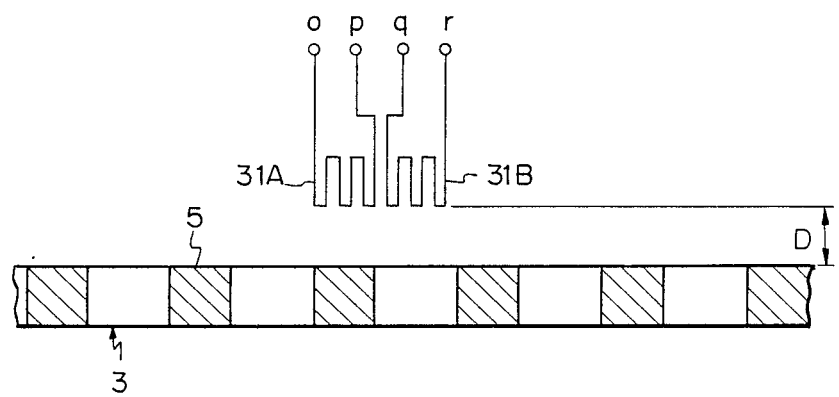
FIG. 10 shows arrangement of the detection head on the rotary encoder shown in FIG. 9.
Figure 11:
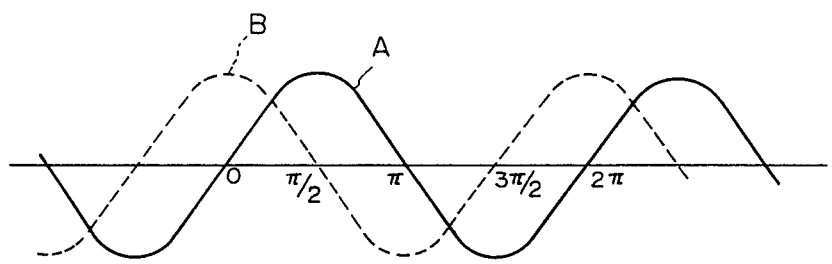
FIG. 11 is a graph for showing the detection outputs from the detection head shown in FIG. 10.
Figure 12:
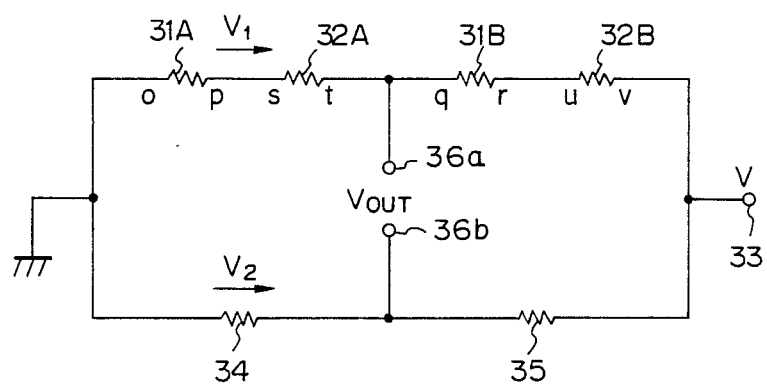
FIG. 12 is a circuit diagram of the bridge circuit used for the rotary encoder shown in FIG. 9.

One modification of the above-described rotary encoder is shown in FIG. 9, in which two pairs of detecting elements 31A, 31B, 32A and 32B, i.e. magnetic resistor elements, are used. The detecting elements 31A and 31B are located at the position of maximum clearance whereas the detecting elements 32A and 32B are located at the position of minimum clearance. As shown in FIG. 10, the detecting elements 31A and 31B are spaced from each other by a distance equal to $\lambda/4$, $\lambda$ being the wavelength of the signal from the recorded pattern 5 on the recording medium 3. The detecting elements 32A and 32B are spaced from each other in the same way. Thus the detecting elements 31A and 32A generate a detection output A in FIG. 11 and the detecting elements 31B and 32B generates a detection output 13 in FIG. 11. The detection outputs A and B are out of phase with respect to each other by $\lambda/4$. A terminal "p" of the detecting element 31A is connected in series to a terminal "s" of the detecting element 32A, a terminal "r" of the detecting element 31B is connected in series to a terminal "u" of the detecting element 32B, and a terminal "q" of the detecting element 31B is connected in series to a terminal "t" of the detecting element 32A. Resistor elements 34 and 35 are inserted in series between a terminal "o" of the detecting element 31A and a terminal "v" of the detecting element 32B to form a bridge circuit. A voltage "V" is applied to the external terminal 33 and the detection output "Vout" of the circuit is picked up at output terminals 36a and 36b. Such a bridge circuit is shown in FIG. 12 in which the detecting elements 31A and 32A are included in the first branch, the detecting elements 31B and 32B are included in the second branch, and the resistor elements 34 and 35 are included in the third and fourth branches of the bridge circuit.

It is assumed with this bridge circuit that the resistance of the detecting elements 31A, 31B, 32A and 32B at zero magnetic field by the recorded pattern is equal to "R", that a change in resistance corresponding to the maximum fluctuation in clearance is equal to $\Delta R_{max}$, that the degree of change in resistance at detection of the signal from the recorded pattern 5 is equal to $\pm 4\%$ and that the resistance of the resistor elements 34 and 35 is equal to 2R. When the minimum clearance appears on the side of the detecting elements 31A and 31B, the resistance of the detecting element 31A is equal to 1.04 $(R+\Delta R_{max})$, the resistance of the detecting element 31B is equal to 0.96 $(R+\Delta R_{max})$, the resistance of the detecting element 32A is equal to 1.04 $(R-\Delta R_{max})$ and the resistance of the detecting element 32B is equal to 0.96 $(R-\Delta R_{max})$. Then the voltage "$V_1$" between the detecting elements 31A and 32A and the voltage "$V_2$" between the terminals of the resistor element 34 are given as follows;

$$V_1 = 2.08R \cdot V/4R = 0.52V \quad (1)$$

$$V_2 = 2R \cdot V/4R = 0.5V \quad (2)$$

Then the detection output "Vout" picked up at the output terminals 36 is given as follows;

$$V_{out} = V_1 = V_2 = 0.02V \quad (3)$$

From this equation, it is clear that the detection output "Vout" is dependent upon the applied voltage "V" only without being influenced by fluctuations in clearance.

What is claimed is:

1. An improved non-contact type rotary encoder comprising:
   (a) a rotary shaft;
   (b) a planar recording medium mounted on said rotary shaft and having a magnetized pattern recorded thereon;
   (c) a detection head including a detecting element; and
   (d) means for holding said detection head at a location that will cause said detecting head to be spaced from and to face said recorded pattern on said recording medium, said means comprising:
      (1) a fixed bracket;
      (2) a flexible supporter plate mounted at its proximal end to said bracket and carrying at its free end said detecting head;
      (3) spring means for urging said supporter plate, and therefore said detecting head toward said recording medium; and
      (4) means for ejecting air via said flexible support plate and said detection head against said recording medium so as to counter the force of said spring means and cause said detecting head to remain a constant distance from said recording medium.

2. An improved non-contact type rotary encoder, comprising:
   (a) a rotary shaft;
   (b) a generally planar recording medium coupled to said rotary shaft for both axial and rotational movement with said shaft; said recording medium having a magnetic pattern recorded thereon;
   (c) a base plate coupled to said shaft for axial movement with said shaft but being idly coupled to said shaft relative to said rotational movement of said shaft; and
   (d) a detection head mounted on said base plate at a location corresponding to said magnetic pattern.

3. An improved non-contact detection type rotary encoder as claimed in claim 2 in which said base plate is locked against axial rotation relative to said shaft by means of a pin-recess engagement.

4. An improved non-contact detection type rotary encoder as claimed in claim 2 in which said base plate is locked against axial rotation relative to said shaft by means of a spring force.

5. An improved non-contact type rotary encoder, comprising:
   (a) a rotary shaft;
   (b) a disc shaped recording medium mounted on said rotary shaft and being rotatable therewith, said recording medium having a substantially planar recording surface lying perpendicular to an axis of said shaft and having a magnetized pattern recorded along a circle which is concentric with said axis; said recording surface being slightly warped so that respective portions of said surface deviate from an imaginary plane lying perpendicular to said shaft by respective distances, the positions of maximum and minimum deviation from said imaginary plane being spaced apart by a predetermined distance along said periphery;

(c) first and second detecting elements being located at first and second positions along said circle and being located at fixed positions relative to said imaginary plane and being spaced from and facing said magnetized pattern, said first and second positions being spaced apart by said predetermined distance; and (d) electrical means coupled to said first and second detecting elements for generating an output signal indicative of said magnetized pattern but independent of variations in the distance between said detecting elements and said recording surface as said recording surface and said detecting elements are rotated with respect to one another.

6. An improved non-contact detection type rotary encoder as claimed in claim 5, in which said electrical means couple said first and second detecting elements to one another in series fashion.

7. An improved non-contact type rotary encoder as claimed in claim 5, wherein said electrical means include the bridge circuit which includes said detecting elements in different branches of said bridge circuit.

* * * * *